(12) United States Patent
Hashimoto

(10) Patent No.: US 7,361,029 B2
(45) Date of Patent: Apr. 22, 2008

(54) IC PACKAGE, IC SOCKET, AND IC SOCKET ASSEMBLY

(75) Inventor: Shinichi Hashimoto, Kanagawa (JP)

(73) Assignee: Tyco Electronics AMP K.K, Kanagawa-Ken (JP)

( * ) Notice: Subject to any disclaimer, the term of this patent is extended or adjusted under 35 U.S.C. 154(b) by 0 days.

(21) Appl. No.: 11/372,572

(22) Filed: Mar. 10, 2006

(65) Prior Publication Data

US 2006/0205259 A1 Sep. 14, 2006

(30) Foreign Application Priority Data

Mar. 10, 2005 (JP) ............................. 2005-066688

(51) Int. Cl.
*H01R 12/00* (2006.01)
(52) U.S. Cl. .................. 439/71; 439/264; 439/330; 439/525
(58) Field of Classification Search ............ 439/70–73, 439/264, 330, 525
See application file for complete search history.

(56) References Cited

U.S. PATENT DOCUMENTS 3,865,458 A * 2/1975 Pauza et al. ................. 439/345
4,918,513 A * 4/1990 Kurose et al. ................. 439/73
2004/0095693 A1 5/2004 Shirai et al.
2006/0052011 A1* 3/2006 Goodman et al. .......... 439/700

FOREIGN PATENT DOCUMENTS

EP 1006618 A2 6/2000

* cited by examiner

*Primary Examiner*—Truc Nguyen
(74) *Attorney, Agent, or Firm*—Barley Snyder LLC

(57) ABSTRACT

An IC socket assembly includes an IC socket, constituted by: a plurality of electrical contacts; an IC package mounting surface; an insulative socket housing for holding the plurality of electrical contacts at the IC package mounting surface; and an urging member for urging an IC package, which is mounted on the IC package mounting surface, toward the plurality of electrical contacts so as to establish electrical connections therewith; and the IC package. The IC package has a frame member provided about the periphery of a main body thereof.

31 Claims, 16 Drawing Sheets

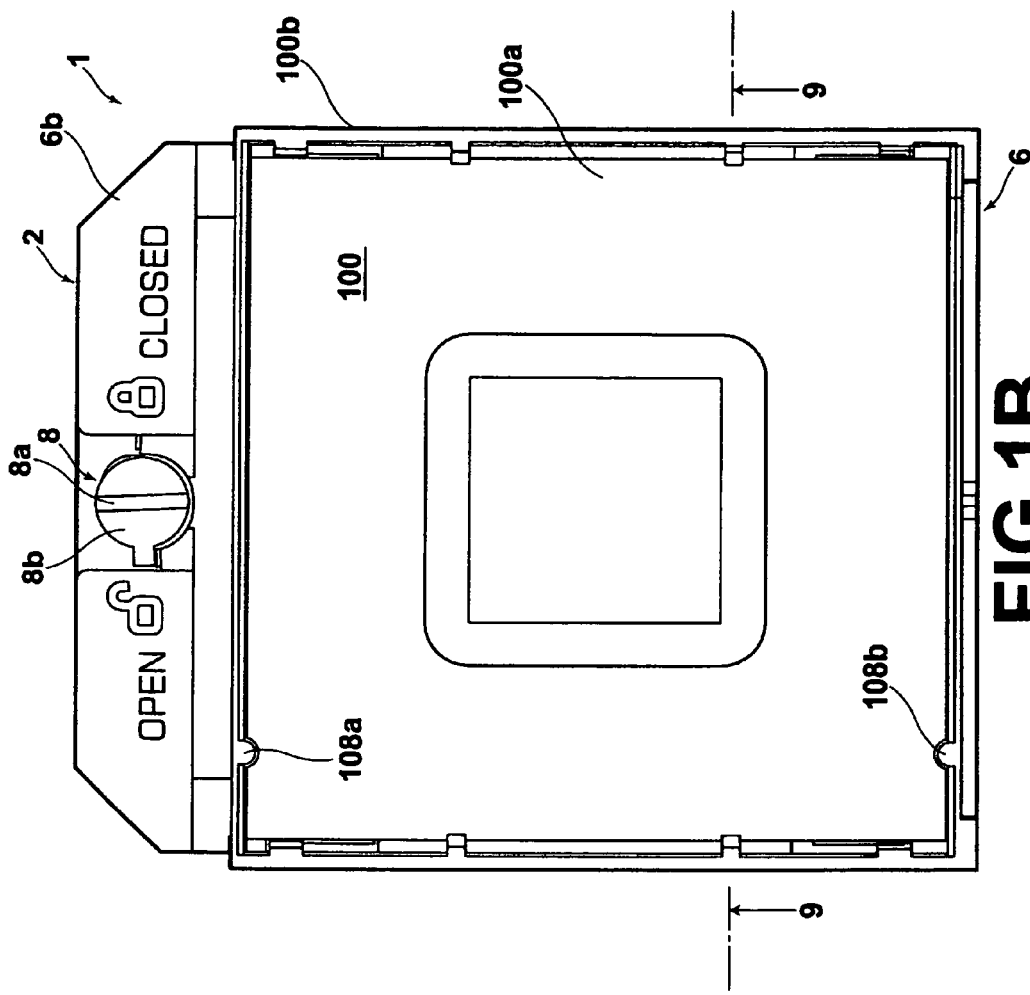
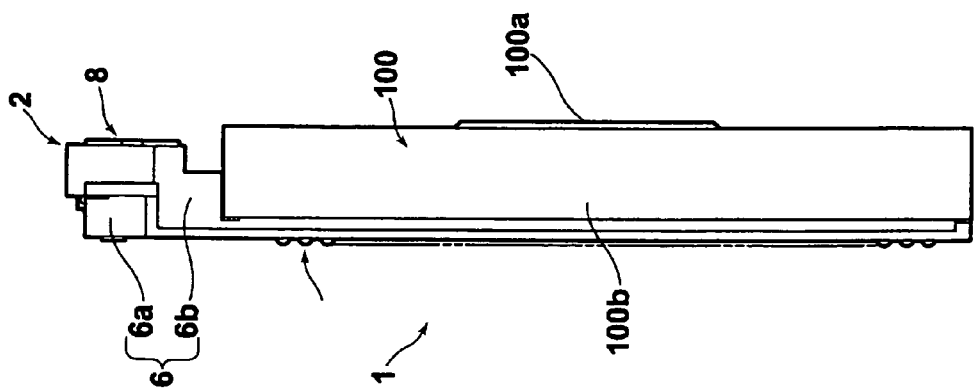
FIG.1B
FIG.1A

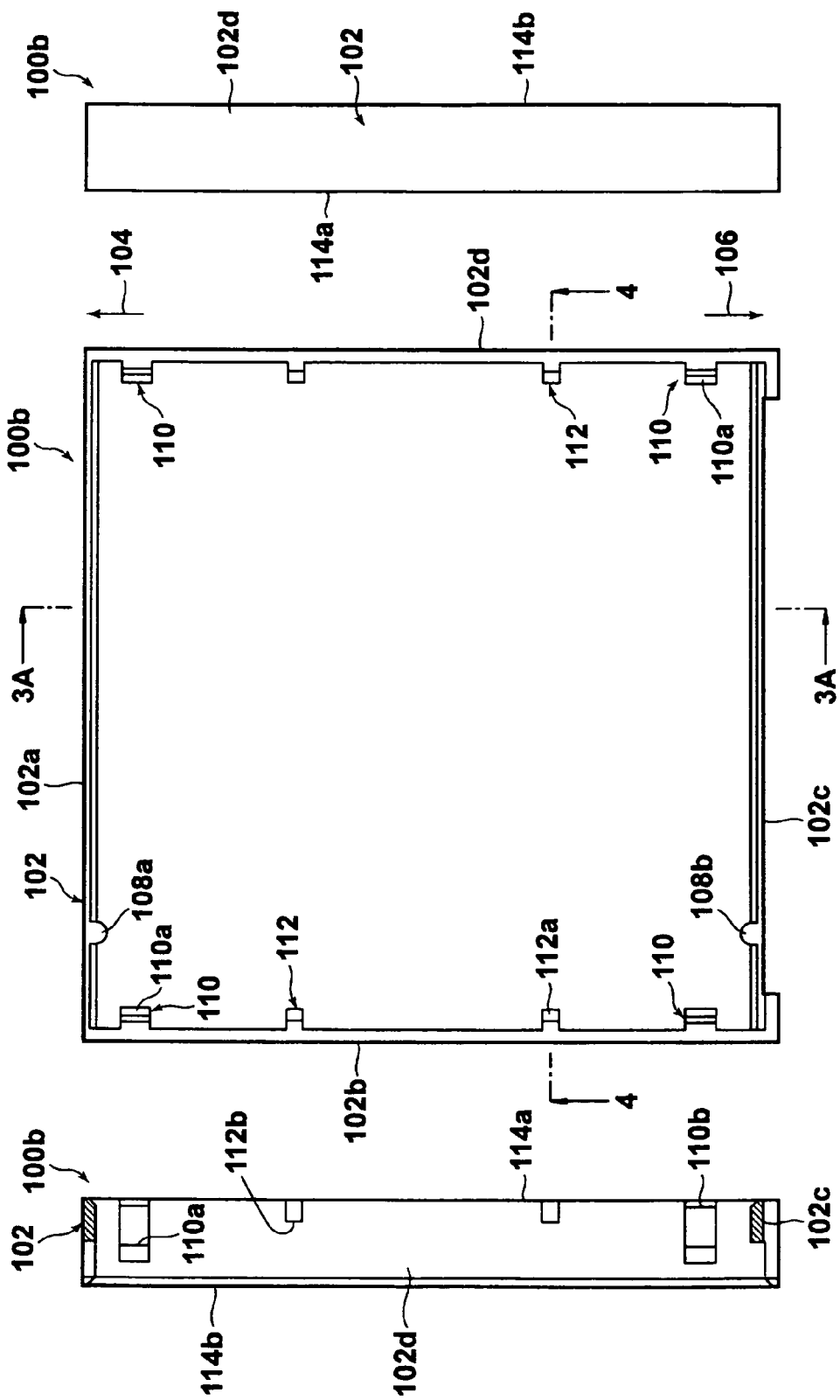

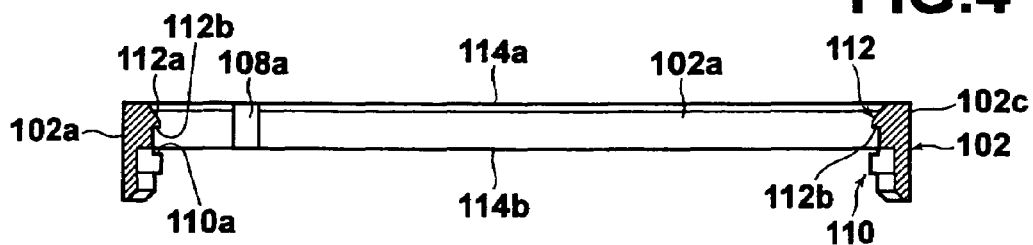
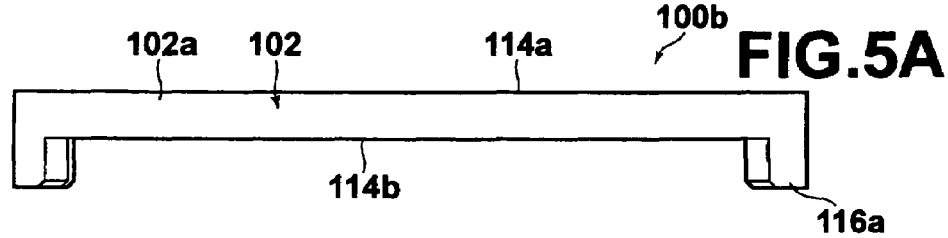
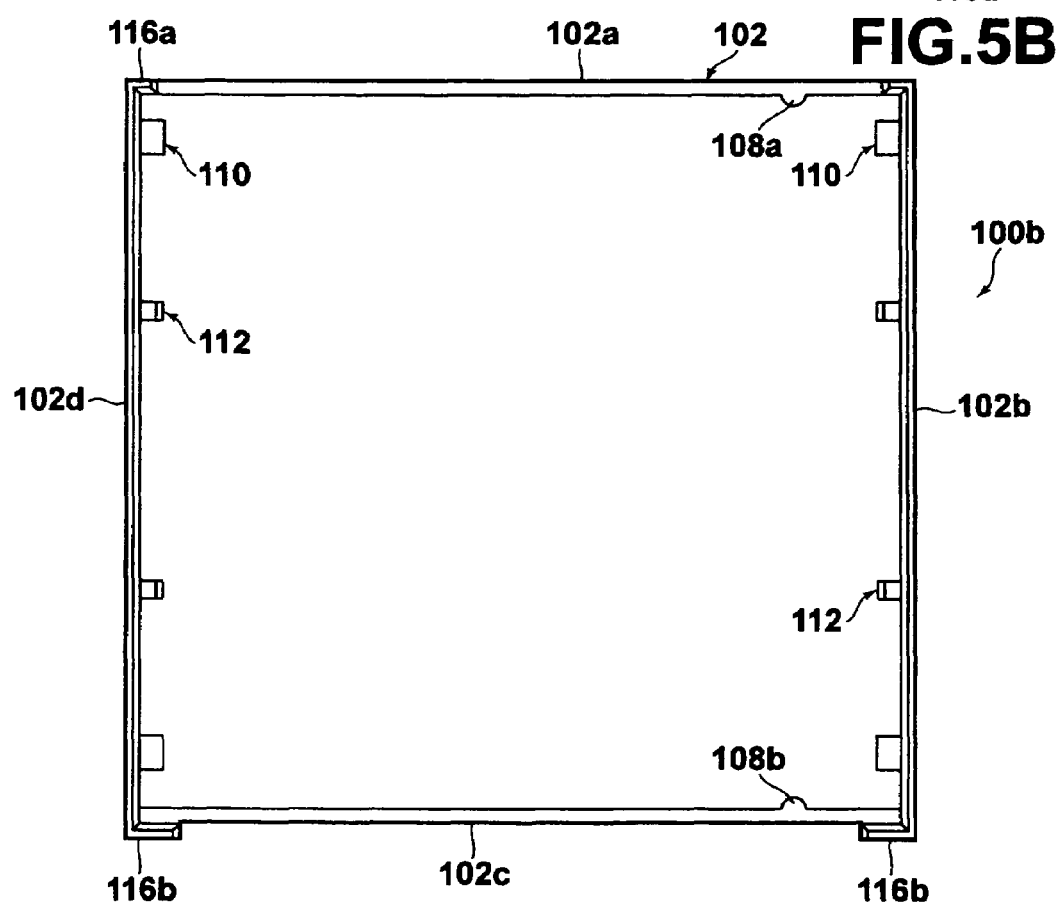
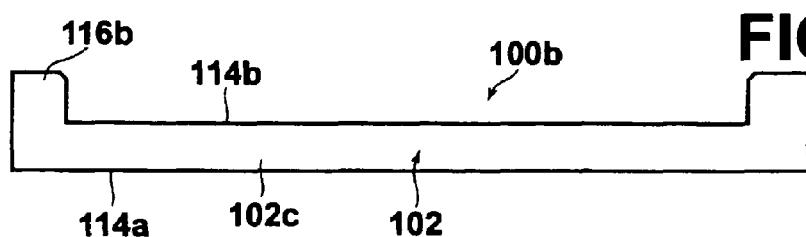

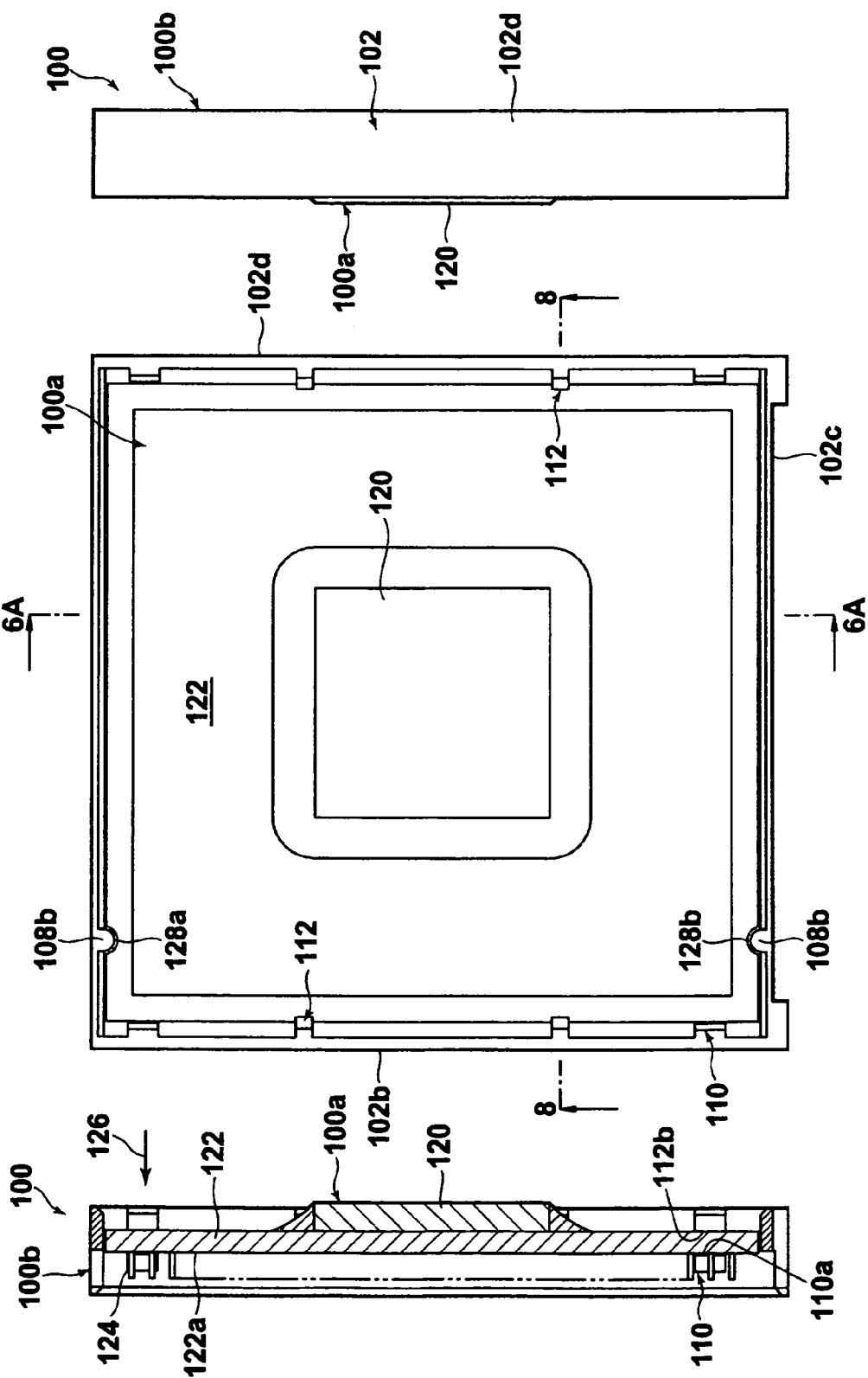

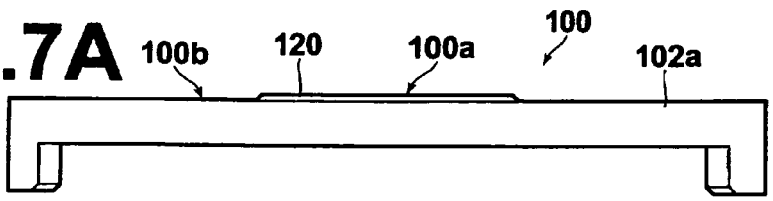
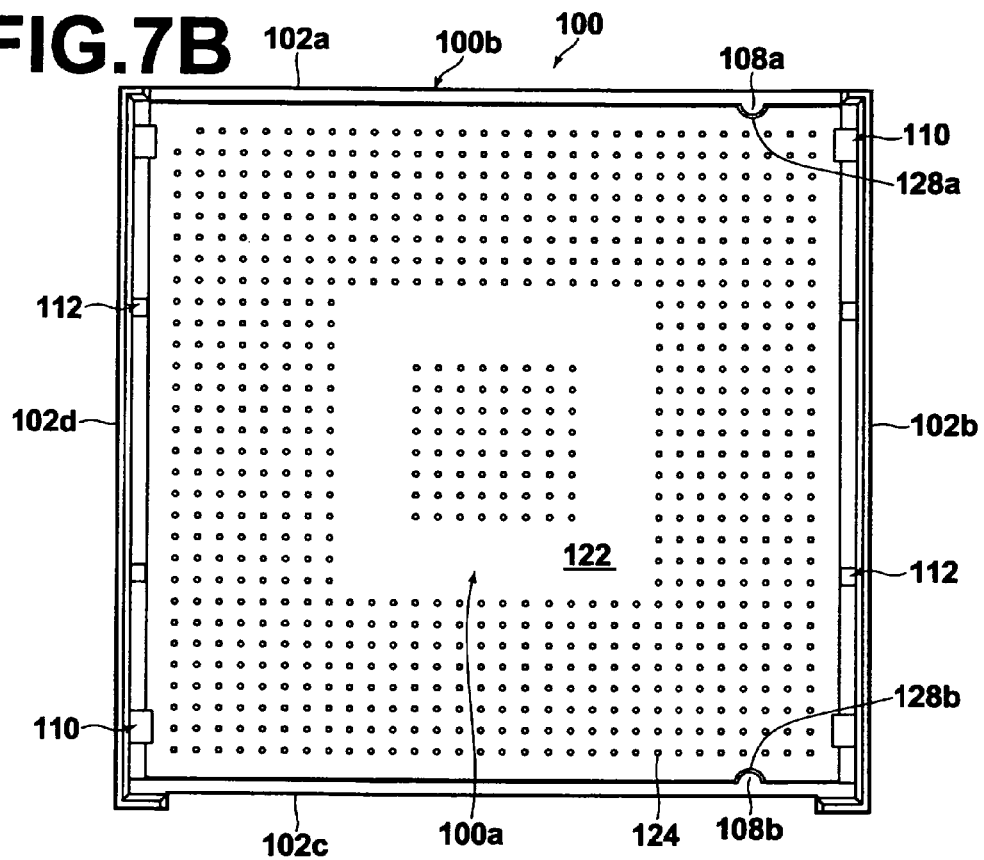
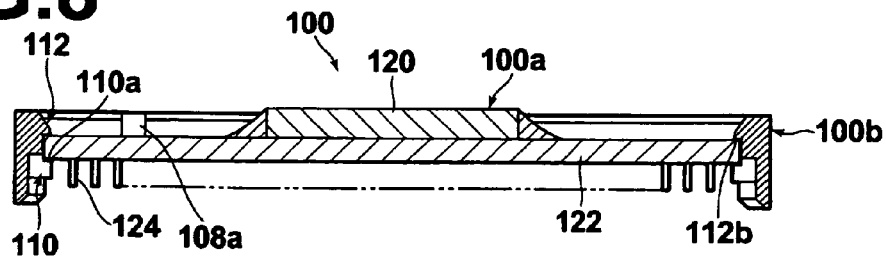

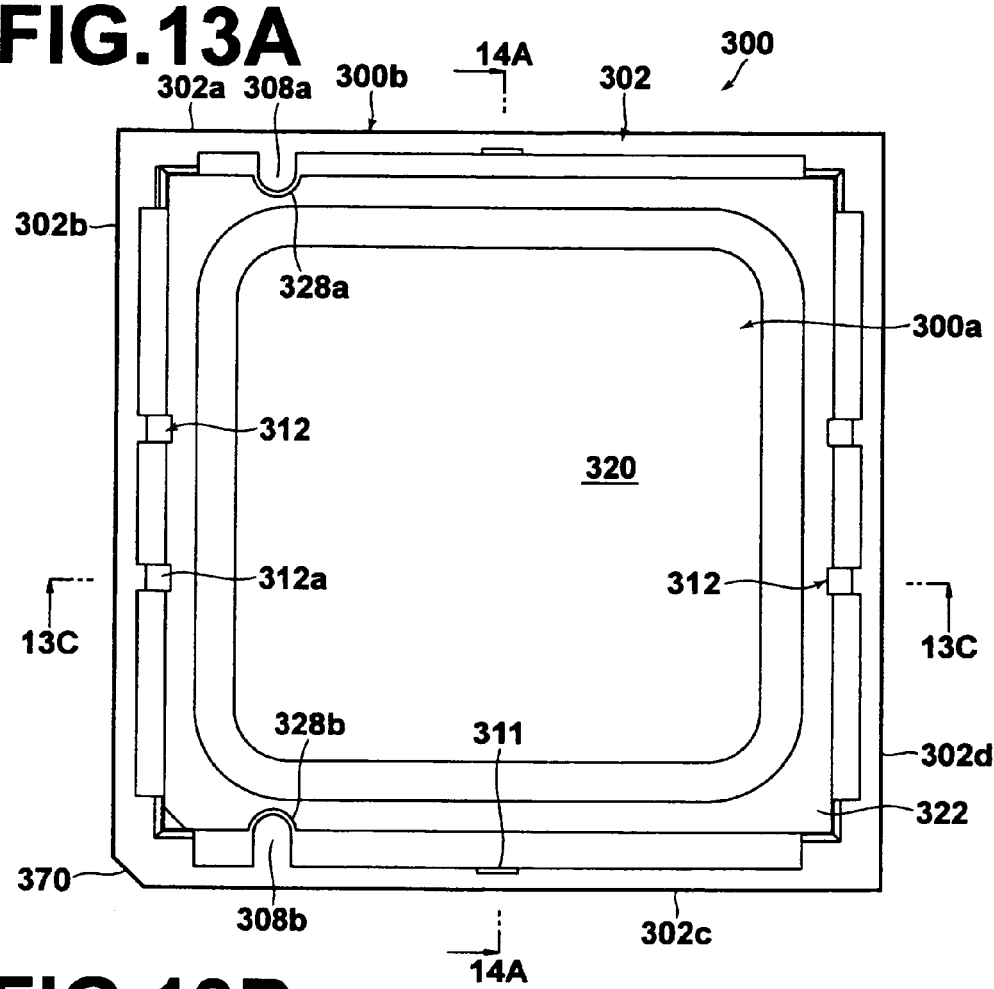
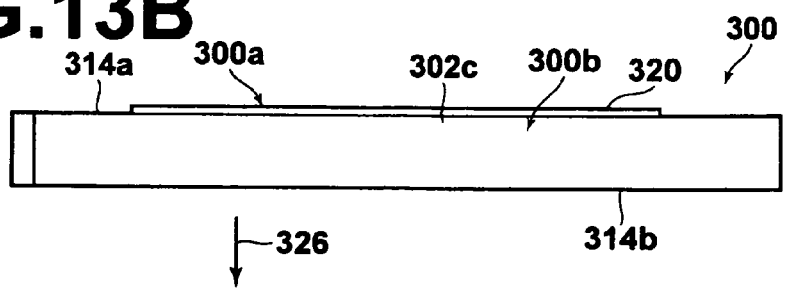
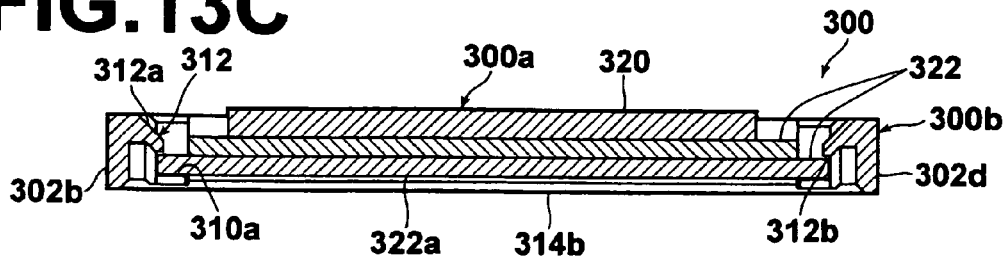

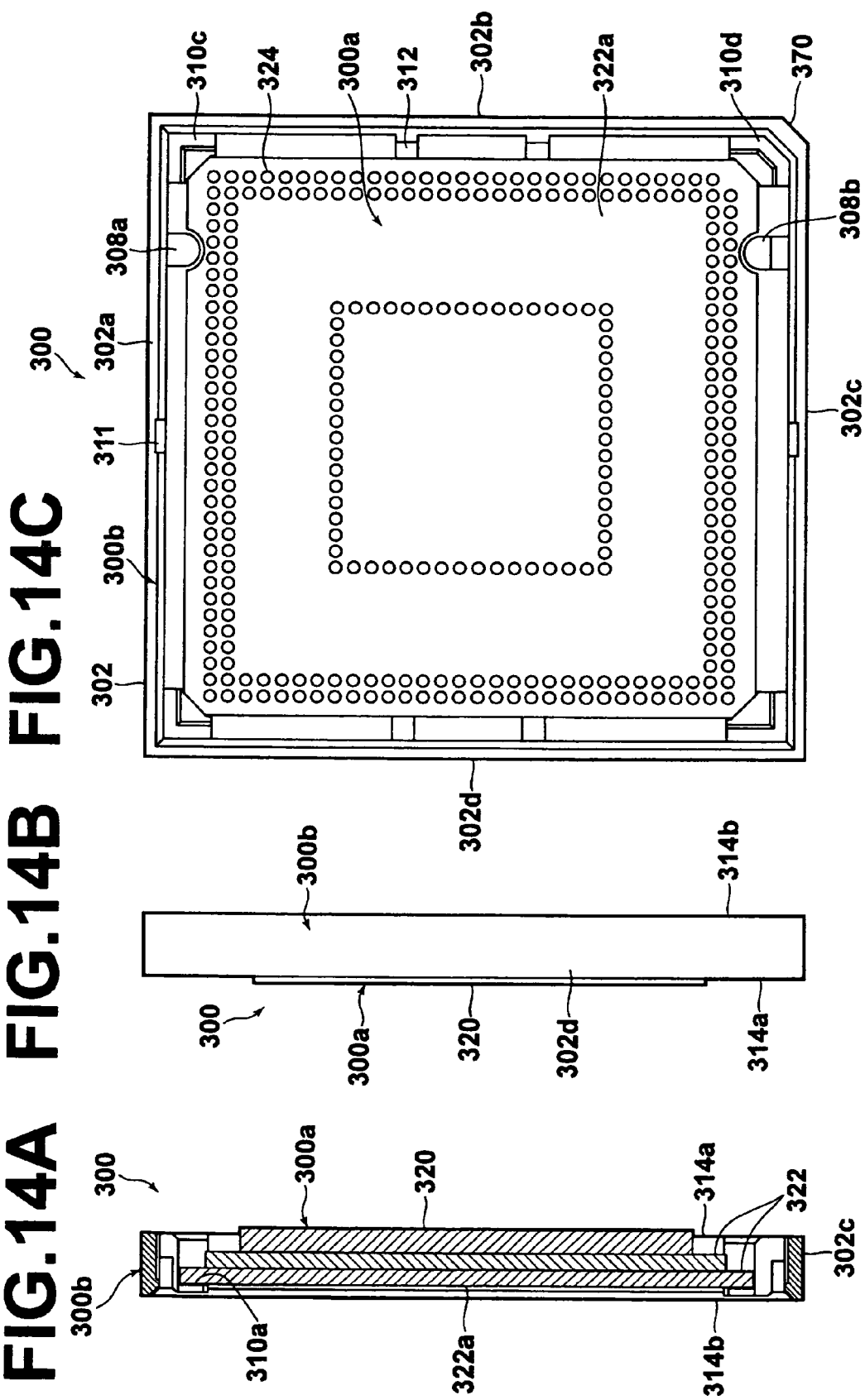

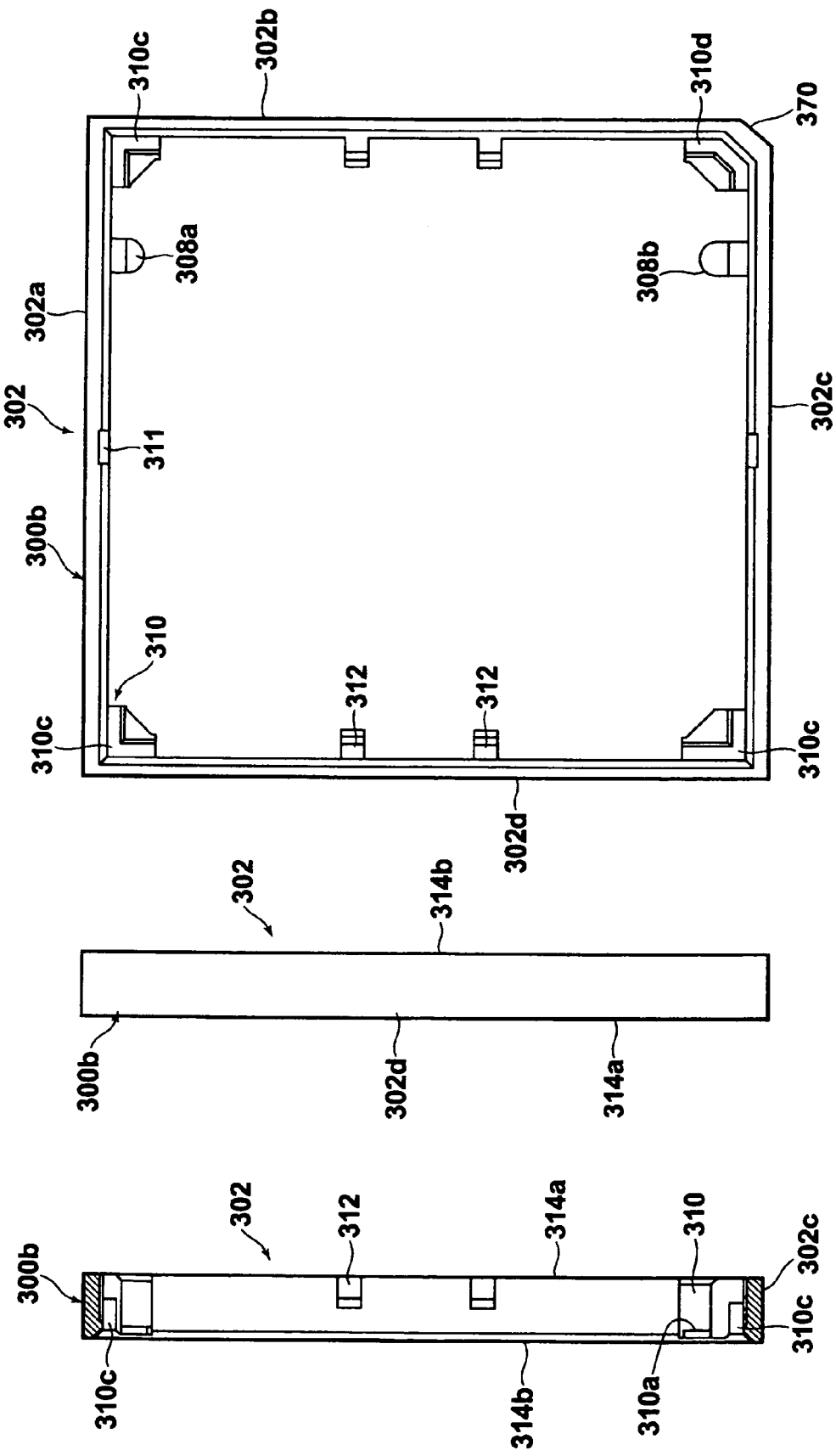

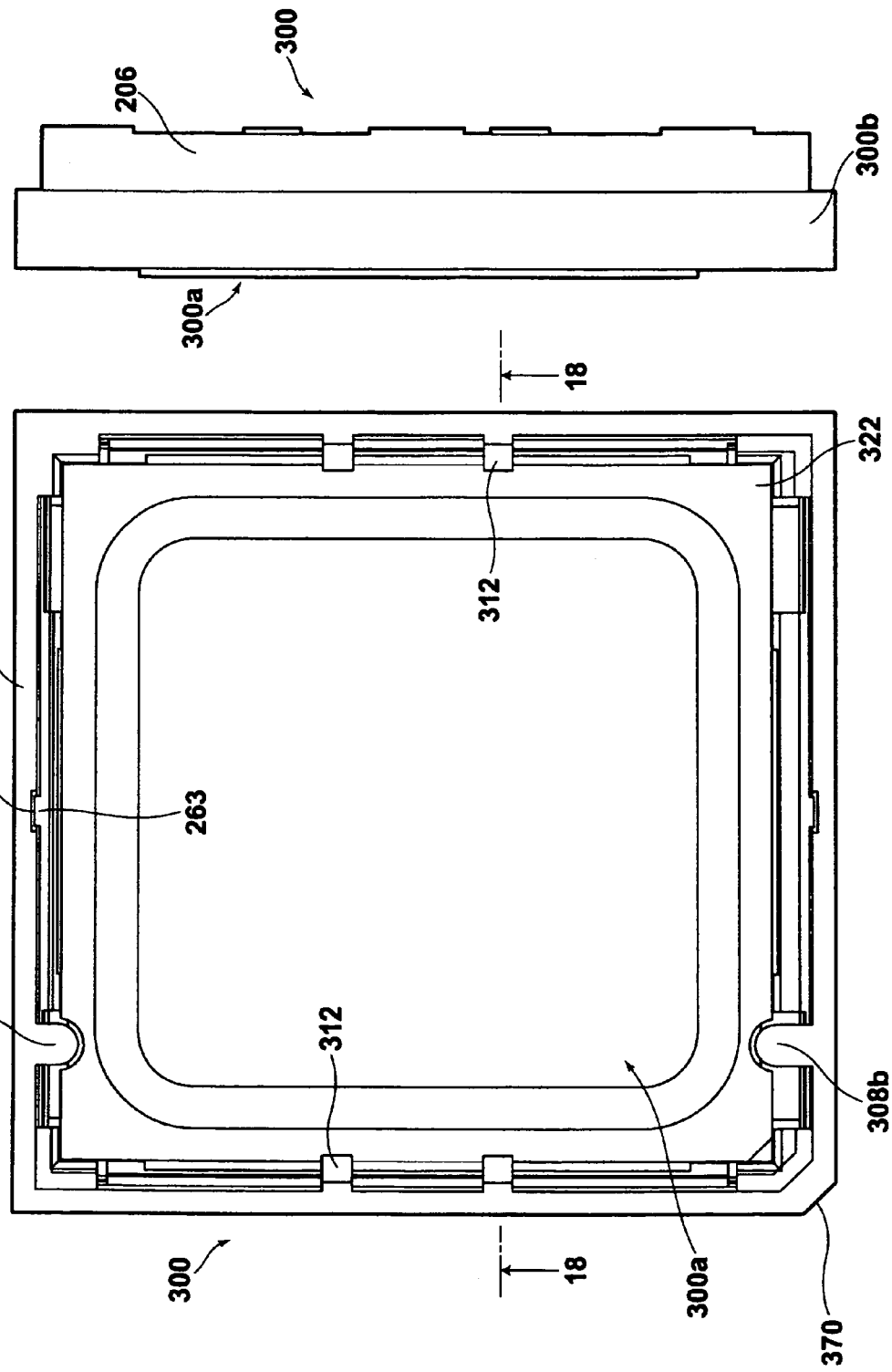

IC PACKAGE, IC SOCKET, AND IC SOCKET ASSEMBLY

FIELD OF THE INVENTION

The present invention relates to an integrated circuit (IC) package, an IC socket, and an IC socket assembly. Particularly, the present invention relates to an IC package of the Pin Grid Array (PGA) or the Land Grid Array (LGA) type, an IC socket and an IC socket assembly which are compatible with this type of IC package.

BACKGROUND OF THE INVENTION

There are known PGA sockets and LGA sockets for IC packages. As an example, European Patent Application Publication No. 1 006 618 discloses an IC socket for PGA packages. This IC socket comprises: an insulative base housing equipped with a great number of terminals (contacts) in a matrix arrangement, a slide member having a great number of through holes in a matrix arrangement above the base housing and sliding means for sliding the slide member on the base housing. An IC package which is compatible with this type of IC socket comprises a great number of lead pins that function as electrodes, which are embedded in a surface to be mounted onto the base housing in a matrix arrangement that corresponds to the terminals of the IC socket. When the IC package is mounted onto the base housing, the lead pins pass through the through holes of the slide member and reach the terminals. However, electrical connections are not established among the lead pins and the terminals at this point. A great amount of operational force is required to cause the lead pins and the terminals to contact each other to establish electrical connections therebetween because of the great number of lead pins involved. For this reason, mechanical means, such as the aforementioned slide member, is generally employed. The slide member causes the IC package to slide horizontally, thereby causing the lead pins and the terminals to contact each other.

U.S. Patent Application Publication No. 20040095693 discloses an IC socket for LGA packages. This IC socket comprises: an insulative inner housing (socket housing); a great number of terminals (contacts) provided in the inner housing in a matrix arrangement; a metal plate, on which the inner housing is mounted; an outer housing having an opening that accommodates the inner housing, provided on the metal plate; a cover member, which is pivotally mounted to one end of the outer housing so as to be rotatable with respect thereto; and a lever for locking the cover member onto the metal plate in a closed state, provided at the other end of the outer housing. The terminals in this type of IC socket protrude diagonally from the IC package mounting surface thereof, and the protruding portions are resiliently movable with respect to the mounting surface. Meanwhile, an IC package, which is compatible with this type of IC socket, comprises a great number of pads for contacting the terminals in a matrix arrangement. The cover member is placed over the IC package after the IC package is placed on the inner housing, and the cover member is driven to press the IC package against the inner housing by operating the lever. The cover member is locked in the closed position, thereby maintaining electrical connections among the pads of the IC package and the terminals of the inner housing in a pressurized state.

In the IC socket of European Patent Application Publication No. 1 006 618, the lead pins embedded in the PGA package are provided at high density with narrow pitch, and are therefore are extremely thin and prone to deformation due to external force. For example, if the IC package is inadvertently dropped, or is struck by an object, the lead pins deform easily. In addition, if the IC package is oriented in the wrong direction during mounting onto the IC socket, excessive force is imparted on the lead pins, and there is a possibility that they will be deformed. Even if the IC package is mounted in the correct orientation, there is a possibility that the lead pins will become deformed depending on the manner of operation, because the lead pins themselves function as insertion guides.

In the IC socket of U.S. Patent Application Publication No. 20040095693, LGA type IC packages are smaller than the IC package mounting surface of the inner housing, that is, the socket housing. Therefore, if the IC package is inadvertently dropped onto the socket housing during mounting thereof, there is a possibility that the IC package will strike the terminals of the socket housing and deform them.

In addition, in the case that the IC package is oriented in the wrong direction during mounting onto the IC socket, a finger that removes the IC package to remount it in the correction orientation may contact the terminals of the IC socket and deform them. Even in the case that the IC package is mounted in the correct orientation, a finger of an operator who is holding the IC package may inadvertently contact the protruding terminals of the IC socket and deform them, because the IC package is smaller than the IC package mounting surface of the IC socket.

SUMMARY

The present invention has been developed in view of the foregoing circumstances. It is an object of the present invention to provide an IC package, an IC socket, and an IC socket assembly that prevents deformation of lead pins of PGA packages, and prevents deformation of the terminals of LGA packages.

It is another object of the present invention to provide an IC package, an IC socket, and an IC socket assembly which have good operability.

The IC package of the present invention is an IC package to be mounted onto an IC socket having an IC package main body and a frame member provided about the periphery of the IC package main body. The IC socket has a plurality of electrical contacts, an IC package mounting surface, an insulative socket housing for holding the plurality of electrical contacts at the IC package mounting surface and an urging member for urging an IC package, which is mounted on the IC package mounting surface, toward the plurality of electrical contacts so as to establish electrical connections therewith. The IC package has a frame member provided about the periphery of the main body thereof.

A configuration may be adopted, wherein the frame member of the IC package and the socket housing of the IC socket guide and position each other during mounting via a keying mechanism.

BRIEF DESCRIPTION OF THE DRAWINGS

The invention will now be described by way of example with reference to the accompanying figures of which:

FIGS. 1A and 1B illustrate an IC socket assembly according to a first embodiment of the present invention, wherein: FIG. 1A is a side view; and FIG. 1B is a plan view;

FIGS. 2A and 2B illustrate an IC socket which is utilized in the IC socket assembly of FIG. 1, wherein: FIG. 2A is a side view; and FIG. 2B is a plan view;

FIGS. 3A, 3B, and 3C illustrate a frame member of an IC package which is employed in the IC socket assembly of FIG. 1, wherein: FIG. 3A is a sectional view taken along line 3A-3A of FIG. 3B; FIG. 3B is a plan view; and FIG. 3C is a side view;

FIG. 4 is a sectional view taken along line 4-4 of FIG. 3B;

FIGS. 5A, 5B, and 5C illustrate the frame member of FIG. 3, wherein: FIG. 5A is a rear view; FIG. 5B is a bottom view; and FIG. 5C is a front view;

FIGS. 6A, 6B, and 6C illustrate an IC package of the present invention, wherein: FIG. 6A is a sectional view taken along line 6A-6A of FIG. 6B; FIG. 6B is a plan view; and FIG. 6C is a side view;

FIGS. 7A and 7B illustrate the IC package of FIG. 6, wherein: FIG. 7A is a rear view, and FIG. 7B is a bottom view;

FIG. 8 is a sectional view of the IC package of FIG. 6, taken along line 8-8 of FIG. 6B;

FIGS. 10A and 10B illustrate an IC socket assembly according to a second embodiment of the present invention, wherein: FIG. 10A is a plan view; and FIG. 10B is a sectional view taken along line 10B-10B of FIG. 10A;

FIGS. 12A and 12B illustrate a socket housing which is utilized in the IC socket assembly of FIG. 10, wherein: FIG. 12A is a plan view; and FIG. 12B is a side view;

FIGS. 13A, 13B, and 13C illustrate an IC package which is utilized in the IC socket assembly of FIG. 10, wherein: FIG. 13A is a plan view; FIG. 13B is a front view; and FIG. 13C is a sectional view taken along line 13C-13C of FIG. 13A;

FIGS. 14A, 14B, and 14C illustrate the IC package of FIG. 13, wherein: FIG. 14A is a sectional view taken along line 14A-14A of FIG. 13A; FIG. 14B is a side view; and FIG. 14C is a bottom view;

FIGS. 15A, 15B, and 15C illustrate a frame member of the IC package of FIG. 14, wherein: FIG. 15A is a plan view; FIG. 15B is a front view; and FIG. 15C is a sectional view taken along line 15C-15C of FIG. 15A;

FIGS. 16A, 16B, and 16C illustrate the frame member of FIG. 15, wherein: FIG. 16A is a sectional view taken along line 16A-16A of FIG. 15A; FIG. 16B is a side view; and FIG. 16C is a bottom view;

FIGS. 17A and 17B illustrate a state in which the IC package of FIG. 13 is mounted in the socket housing of FIG. 12, wherein: FIG. 17A is a plan view; and FIG. 17B is a side view.

DESCRIPTION OF THE PREFERRED EMBODIMENTS

Figure 2B:
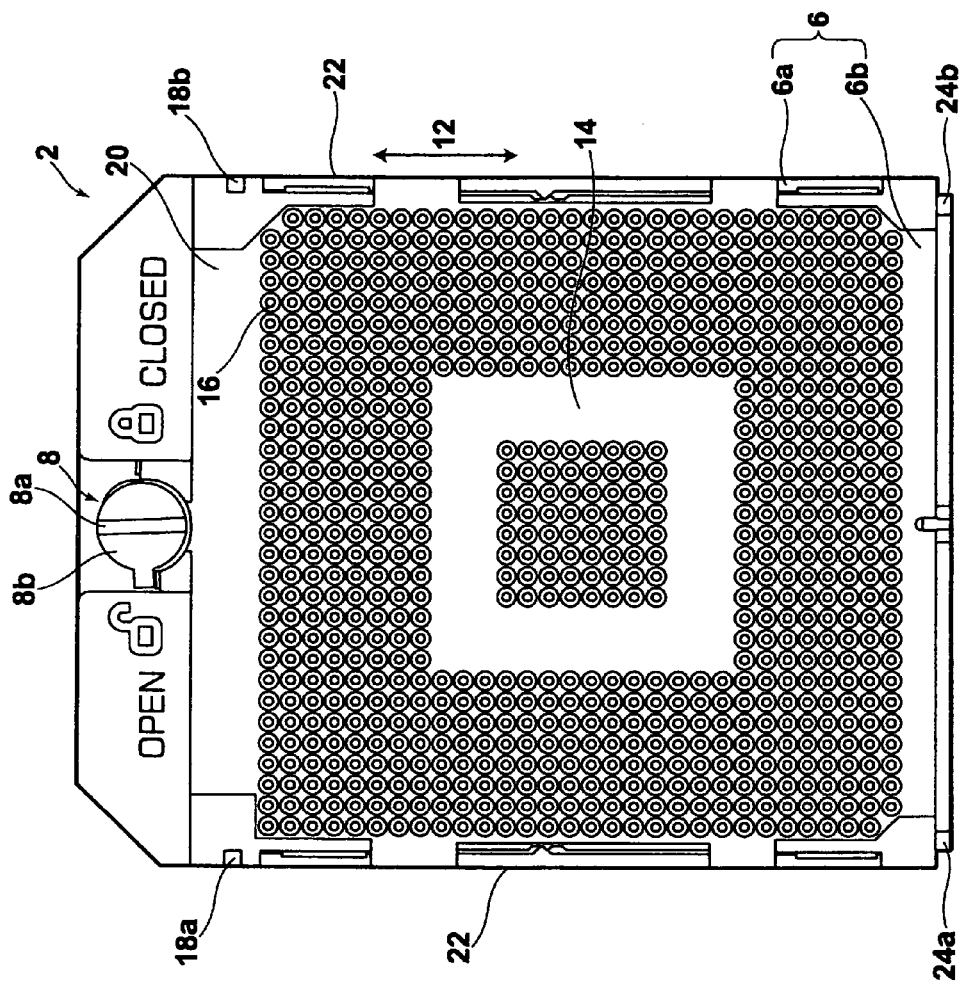

Hereinafter, embodiments of the IC socket assembly of the present invention will be described in detail, with reference to the attached drawings. FIGS. 1A and 1B illustrate an IC socket assembly 1 according to a first embodiment of the present invention. The IC socket assembly 1 comprises a substantially rectangular IC socket 2 and a PGA package 100 which is mounted in the IC socket 2. The IC socket 2 comprises electrical contacts 30 (hereinafter, simply referred to as "contacts"), a base housing 6a that holds the contacts 30 in a matrix arrangement and a cover housing 6b that slides above the base housing 6a. The base housing 6a and the cover housing 6b are collectively referred to as a socket housing 6.

The IC package 100 is mounted on the cover housing 6b of the socket housing 6. The IC socket 2 comprises a cam mechanism 8 for sliding the cover housing 6b after the IC package 100 is mounted onto the socket housing 2. The cam mechanism 8 comprises a cam member 8b having a groove 8a to be rotated by a tool (not shown). However, the construction of the cam mechanism 8 is not limited to this and any known actuating mechanism may be employed. In addition, the IC package 100 illustrated in FIGS. 1A and 1B comprises: an IC package main body 100a and a frame member 100b which is mounted about the periphery of the IC package main body 100a.

Figure 2A:
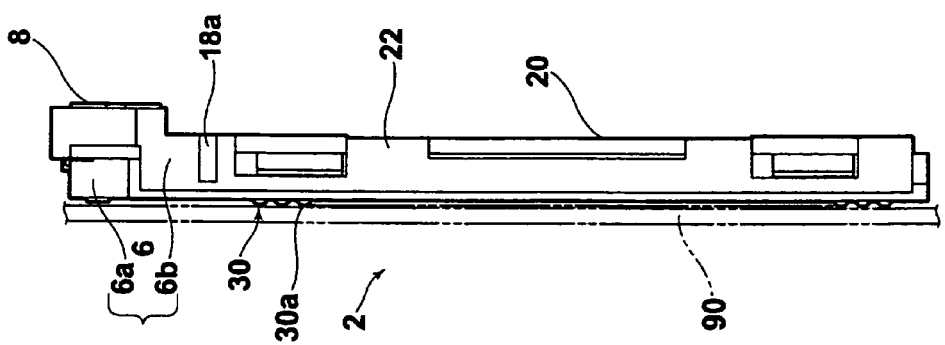

Next, the IC socket 2 will be described with reference to FIGS. 2A and 2B. Tines 30a of the contacts 30 extend through the lower surface of the base housing 6a. The times 30a are to be soldered onto a printed circuit board 90. The cover housing 6b is mounted onto the upper surface of the base housing 6a such that it is slidable in the direction indicated by arrow 12. The cover housing 6b comprises an upper wall 20 and side walls 22. The sliding motion of the cover housing 6b is realized by operating the cam mechanism 8. The cover housing 6b is configured to slide between an open position, at which it is capable of receiving the IC package 100, and a closed position, at which lead pins 124 (refer to FIG. 6a) of the IC package 100 and the contacts 30 contact each other. The cover housing 6b is illustrated in the open position in FIGS. 2A and 2B.

The upper surface of the cover housing 6b serves as an IC package mounting surface 14, and a great number of apertures 16 corresponding to the contacts 30 are provided therein. Vertically extending keying grooves 18a and 18b are formed in both side walls 22 at the end of the cover housing 6b towards the cam mechanism 8, that is, a first end. In other words, the keying grooves 18a and 18b extend in a direction perpendicular to the printed circuit board 90. Cutouts 24a and 24b are formed at the corners of the base housing 6a at a second end opposite the first end.

Next, the frame member 100b of the IC package 100 will be described with reference to FIGS. 3A through 5C. FIGS. 3A, 3B, 3C and 4 illustrate the frame member 100b. FIGS. 5A, 5B, and 5C illustrate the frame member 100b. The frame member 100b comprises substantially square peripheral walls 102 that cover the periphery of the IC package main body 100a. The placement of the frame member 100b in FIG. 3B corresponds to the placement of the IC socket 2 in FIGS. 1B and 2B. The sides of the frame member 100b are shown in FIG. 3b with arrows 104 and 106 pointing toward to the first end 104 and the second end 106 of the socket housing 6, respectively.

The IC package main body 100a is mounted to the frame member 100b of FIG. 3B by pressing it into the frame member 100b from the surface of the drawing sheet toward the rear thereof. The peripheral walls 102 are formed as relatively short height walls 102a and 102c, at the first end 104 and the second end 106, as illustrated in FIG. 4 and FIG. 5C. When the frame member 100b is mounted onto the socket housing 6, the walls 102a and 102c are positioned on the cover housing 6b. Meanwhile, walls 102b and 102d that link the walls 102a and 102c to each other are relatively tall in height, so as to cover the socket housing 6 exterior. Protrusions 108a and 108b for preventing erroneous insertion of the IC package 100 are provided toward the left sides of walls 102a and 102c, respectively. Note that for the sake of ease in description, the directions up, down, right, and left in the following description refer to the corresponding directions within the Figure being referenced. The protrusions 108a and 108b are formed as elongate protrusions that extend along the insertion direction of the IC package 100, and have arcuate outer surfaces.

Meanwhile, receiving protrusions 110 are formed on the inner sides of each of the walls 102b and 102d, in the vicinity of the first end 104 and in the vicinity of the second end 106. Each receiving protrusion 110 comprises a receiving base 110a, for receiving the IC package 100, which is placed in the frame member 100b. In addition, tapers 110b for facilitating insertion of the IC package 100 are formed on the receiving protrusions 110 toward the side of the upper edge 114a of the frame member 100b (refer to FIG. 3A). Two extraction preventing protrusions 112 are formed between the two receiving protrusions 110 on each of the walls 102b and 102d, separated from each other. The extraction preventing protrusions 112 extend from the upper edge 114a to the lower edge 114b of the frame member 100b. Tapers 112a (refer to FIG. 4) are formed on the extraction preventing protrusions 112 at the side of the upper edge 114a, to facilitate insertion of the IC package main body 100a. Stop surfaces 112b are formed on the extracting preventing protrusions 112 at the side of the lower edge 114b. The frame member 100b is configured to hold the inserted IC package main body 100a between the receiving bases 110a and the stop surfaces 112b. The receiving protrusions 110 are formed in the vicinities of the corners of the frame member 100b. Therefore, the peripheral walls 102 are not likely to flex, even if loads are applied to the receiving protrusions 110.

As most clearly illustrated in FIGS. 5A and 5B, short ribs 116a are formed at both ends of the short walls 102a. Similarly, ribs 116b are formed at both ends of the wall 102c. The ribs 116a are formed at positions corresponding to the aforementioned keying grooves 18a and 18b (refer to FIG. 2B), and the ribs 116b are formed at positions corresponding to the cutouts 24a and 24b. That is, when the frame member 100b, to which the IC package main body 100a is mounted, is mounted onto the socket housing 6, the short ribs 116a and the keying grooves 18a, 18b, as well as the ribs 116b and the cutouts 24a, 24b perform keying. If an attempt to mount the frame member 100b in an erroneous orientation is made, the ribs 116b will abut the cover housing 6b, because the short ribs 116a and the ribs 116b are of different lengths. The ribs 116b cannot be inserted into the keying grooves 18a and 18b, thereby preventing erroneous assembly. The short ribs 116a are guided by the keying grooves 18a, 18b, and the ribs 116b are guided by the cutouts 24a, 24b. Therefore, the IC package 100 can be mounted smoothly, and accurately positioned with respect to the IC socket 2. It is not necessary for the lead pins 124 of the IC package 100 to have a guiding function, as in conventional IC packages, and therefore the possibility of the lead pins 124 being deformed on insertion is reduced. Accordingly, the lead pins 124 can be made thinner and embedded in the IC package main body 100a at a higher density than in conventional IC packages.

Next, the construction of the IC package 100, in which the frame member 100b is mounted on the IC package main body 100a, will be described with reference to FIGS. 6A through FIG. 8. Note that FIGS. 6A, 6B, and 6C correspond to FIGS. 3A, 3B, and 3C, respectively. First, the IC package main body 100a will be described. The IC package main body 100a comprises a substantially square planar base plate 122, a chip section 120 formed at the center of the base plate 122 and lead pins 124 that protrude from the bottom surface 122a of the base plate 122. The lead pins 124 are arranged in a matrix corresponding to the apertures 16 of the cover housing 6b. Recesses 128a and 128b, which are complementary with the protrusions 108a and 108b of the frame member 100b, are formed in the base plate 122 at positions corresponding to those of the protrusions 108a and 108b.

In order to mount the IC package main body 100a into the frame member 100b, the protrusions 108a and 108b of the frame member 100b are aligned with the recesses 128a and 128b of the IC package main body 100a, then the IC package main body 100a is pressed into the frame member 100b in the direction indicated by arrow 126 of FIG. 6A. On insertion, the IC package main body 100a urges the walls 102b and 102d of the frame member 100b outward via the extraction preventing protrusions 112, and moves toward the interior of the frame member 100b. When the IC package main body 100a passes the stop surfaces 112b, the walls 102b and 102d return resiliently, to hold the IC package main body 100a between the receiving bases 110a of the receiving protrusions 110 and the stop surfaces 112b of the extraction preventing protrusions 112. The IC package 100, including the frame member 100b mounted about the periphery of the IC package main body 100a, is easy to hold and handle. The frame member 100b protects the lead pins 124, therefore the possibility of the lead pins 124 deforming is reduced, even if the IC package 100 is dropped, or inadvertently strikes another object. Note that the walls 102b and 102d may be spread by a jig (not shown) when pressing the IC package main body 100a into the frame member 100b.

Figure 9:
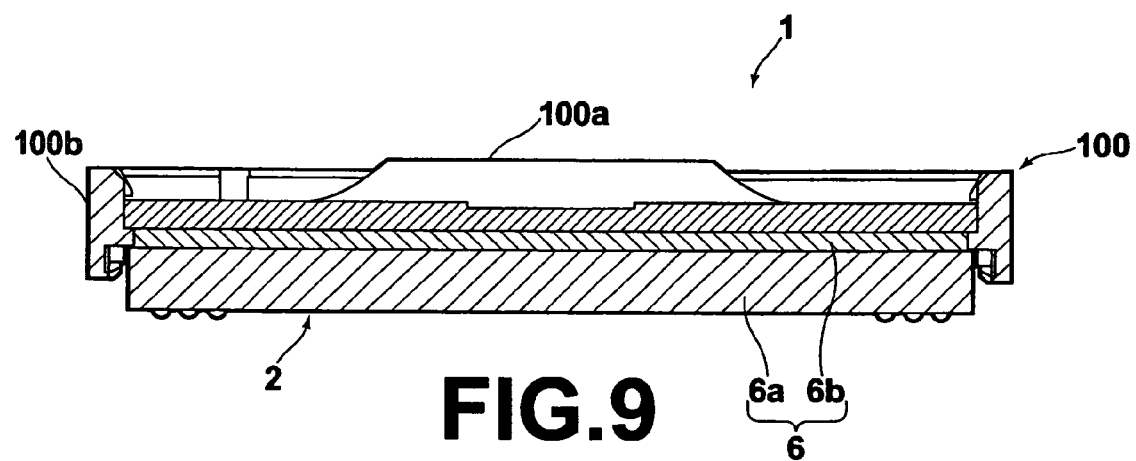
FIG. 9 is a sectional view of the IC socket assembly of FIG. 1, taken along line 9-9 of FIG. 1.

Next, a state in which the IC package 100, constituted as described above, is mounted onto the IC socket 2 will be described with reference to FIG. 9. FIG. 9 is a sectional view of the IC socket assembly 1, taken along line 9-9 of FIG. 1. The IC package 100 is placed on the cover housing 6b of the socket housing 6. At this time, the lead pins 124 penetrate through the apertures 16 (refer to FIG. 2) of the cover housing 6b and are in the vicinity of the contacts 30 of the base housing 6a. The lead pins 124 and the contacts 30 are omitted from FIG. 9. In this state, that is, when the IC package 100 is simply placed on the IC socket 2, the lead pins 124 and the contacts 30 are not electrically connected. In order to establish electrical connections among the lead pins 124 and the contacts 30, the cam mechanism 8 (refer to FIG. 1B) is operated to drive the cover housing 6b to its closed position. Thereby, the IC package 100 moves to the closed position along with the cover housing 6b, and electrical connections are established among the lead pins 124 of the IC package 100 and the contacts 30 of the IC socket 2. This mechanism is a known mechanism, such as that disclosed in European Patent Application Publication No. 1 006 618, so a detailed description thereof will be omitted here.

Figure 10A:
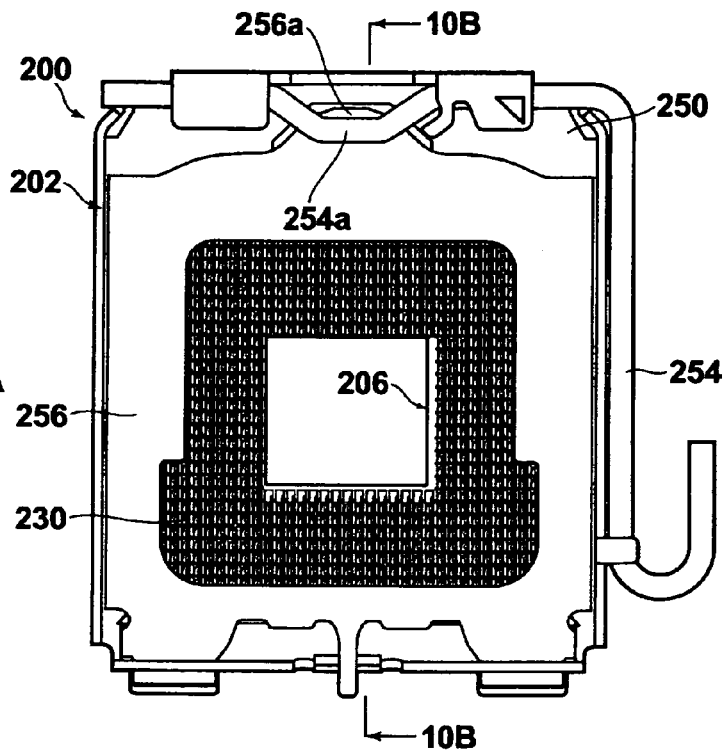
Figure 10B:
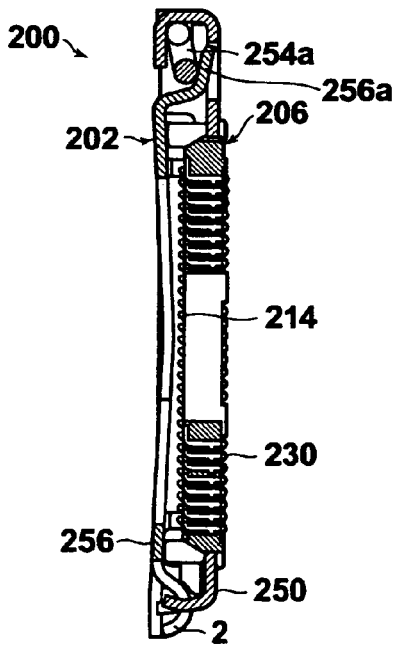
Figure 11:
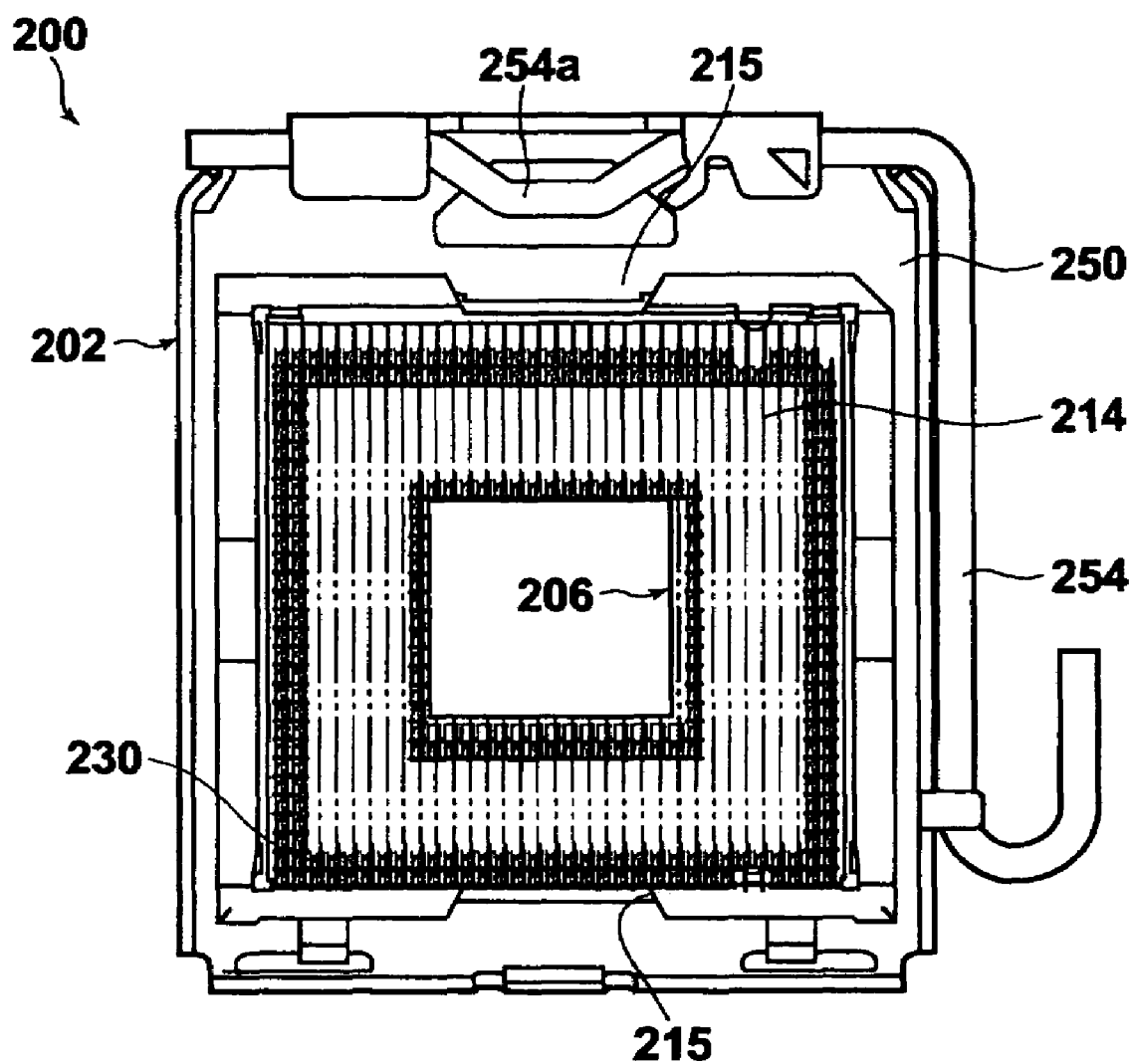
FIG. 11 is a plan view of the IC socket assembly of FIG. 10, from which a cover member has been removed.
Figure 15A:
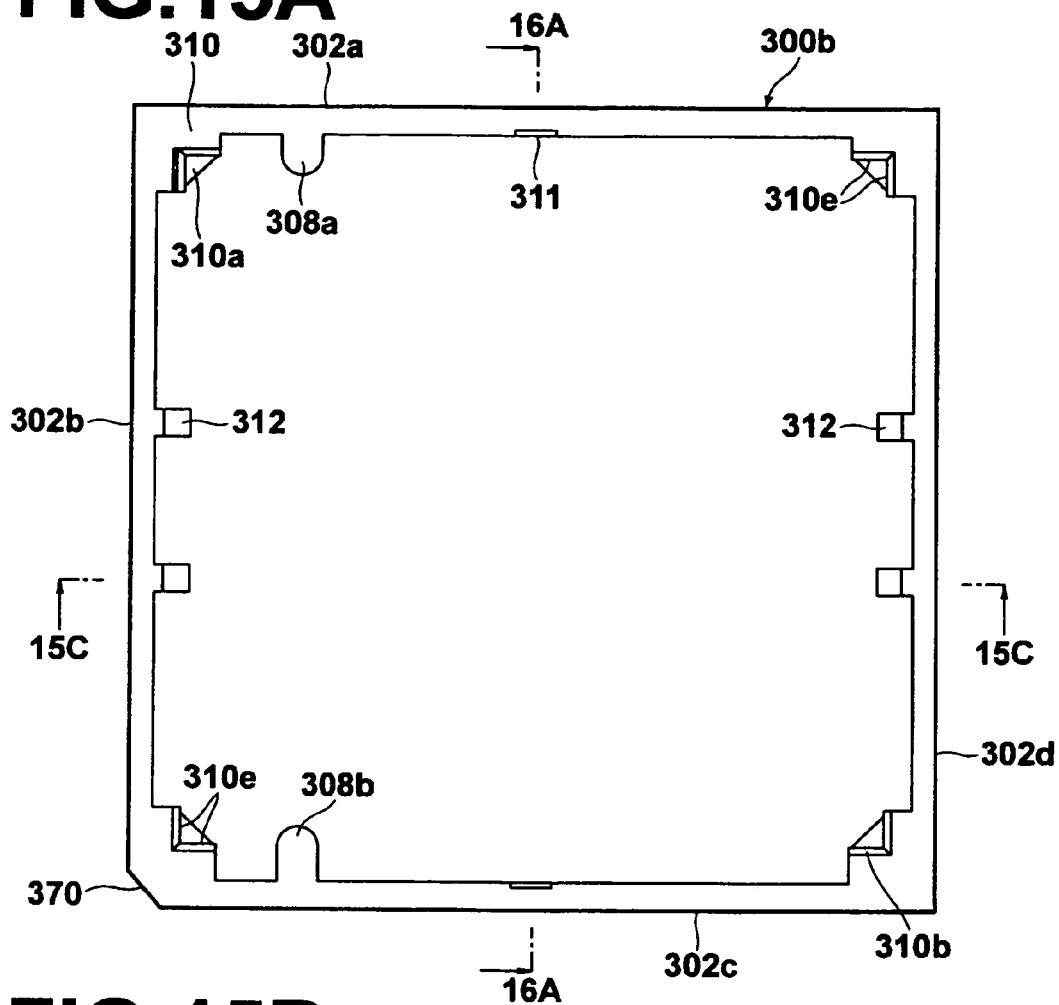
Figure 15B:
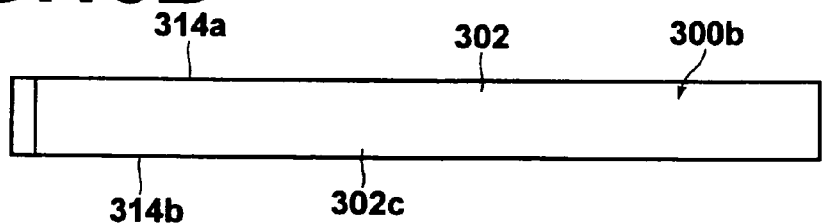
Figure 15C:
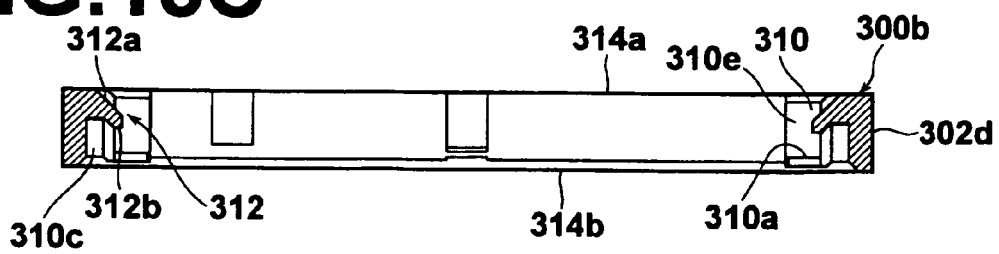

Next, an IC socket assembly according to a second embodiment of the present invention will be described with reference to FIGS. 10A, 10B, and 11. FIGS. 10A, 10B and 11 illustrate an IC socket assembly 200 for an LGA type IC package. Note that the construction of the IC socket assembly according to the second embodiment is similar to that of the IC socket assembly as disclosed in Japanese Patent Application No. 2004-234242, and therefore only the outline thereof will be described. In addition, the LGA type IC package is omitted from FIGS. 10A, 10B, and 11. An IC socket 202 of the IC socket assembly 200 comprises a socket housing 206, a metallic reinforcing plate 250, provided at the bottom surface of the socket housing 206 and a metallic cover member 256, which is pivotally mounted on the reinforcing plate 250 so as to be rotatable with respect thereto. Note that here, the socket housing 206 differs from that of the first embodiment in that it is a single insulative housing.

An IC package mounting surface 214 is formed on the socket housing 206, and a great number of contacts 230 are embedded in the IC package mounting surface 214. A pair of recesses 215 are formed in two outer edges of the socket housing 206. The recesses 215 are provided such that fingers (not shown) that hold an IC package 300 do not come into contact with the socket housing 206, when the IC package 300 is mounted on the IC package mounting surface 214. The cover member 256 that covers the upper portion of the socket housing 206 is pivotally mounted on the reinforcing plate 250 so as to be rotatable with respect thereto. In order to fix the IC package 300 (refer to FIG. 14), which is utilized in the second embodiment, onto the socket housing 206, the IC package 300 is placed between the IC package mounting surface 214 and the cover member 256. Then, a lever 254 urges the IC package 300 downward via the cover member 256. Thereafter, a locking piece 256a at the tip of the cover member 256 is engaged by a locking portion 254a of the lever 254, and the IC package 300 is fixed to the socket housing 206 in a state in which it presses the contacts 230 downward. Note that the lever 254 and the cover member 256 are collectively referred to as an urging mechanism.

Figures 12A, 12B:
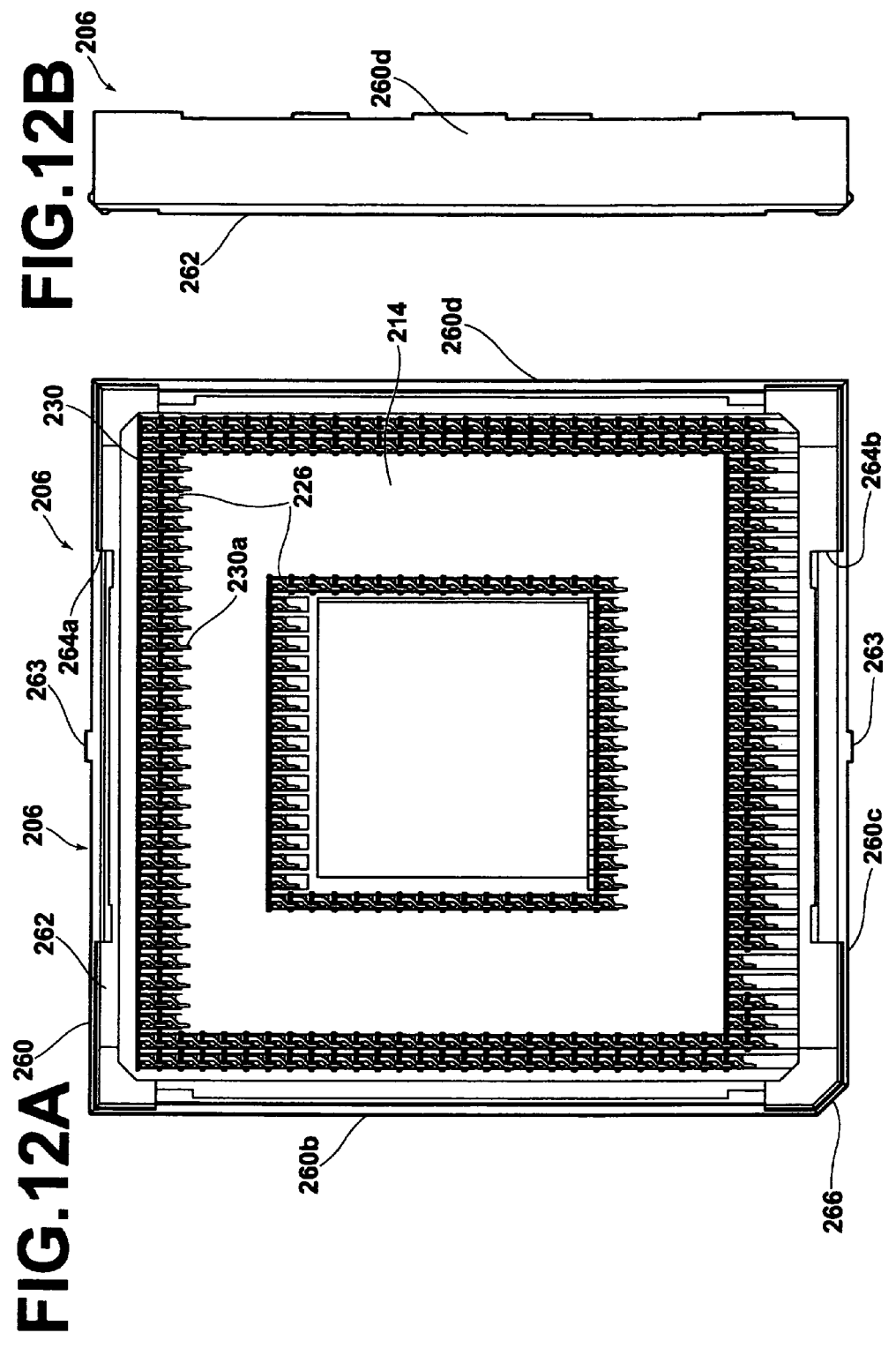

Next, the socket housing 206 of the IC socket 202 will be described with reference to FIGS. 12A and 12B. The socket housing 206 is substantially square in shape, and comprises a rectangular IC package mounting surface 214 and walls 260a, 260b, 260c, and 260d, which are integrally formed with the IC package mounting surface 214 about the periphery thereof. Cutouts 264a and 264b, which are open toward the upper edge 262 of the socket housing 206, are formed in the walls 260a and 260c, respectively. Locking protrusions 263 are formed in the vicinity of the upper edges 262 of the central portions of the walls 260a and 260c. A great number of contact housing apertures 226 are provided in a matrix arrangement through the IC package mounting surface 214, and a contact 230 is provided within each contact housing aperture 226. Note that only a portion of the contact housing apertures 226 and the contacts 230 are illustrated in FIG. 12. However, the contact housing apertures and the contacts 230 are provided across substantially the entirety of the IC package mounting surface 214. Contact portions 230a of the contacts 230 that contact the IC package 300 protrude from the IC package mounting surface 214 (refer to FIG. 18). A cutout surface 266, which is obliquely cut out, is formed at the outer corner between the wall 260b and the wall 260c.

Next, the IC package 300, which is to be mounted on the socket housing 206, will be described with reference to FIGS. 13A through 14C. FIGS. 13A, 13B, 13C, 14A, 14B, and 14C illustrate the IC package 300. The IC package 300 comprises an IC package main body 300a and a frame member 300b, which is mounted about the periphery of the IC package main body 300a. FIGS. 13A through 14C illustrate a state in which the frame member 300b is mounted on the IC package main body 300a.

First, the frame member 300b will be described with combined reference to FIGS. 15A through 16C. The frame member 300b comprises substantially square peripheral walls 302 that cover the periphery of the IC package main body 300a. The placement of the frame member 100b in FIG. 15A corresponds to the placement of the IC package 300 in FIG. 13A. The IC package main body 300a is mounted to the frame member 300b of FIG. 13A by pressing it into the frame member 300b from the surface of the drawing sheet toward the rear thereof. The peripheral walls 302 include four walls 302a, 302b, 302c, and 302d, which are of substantially the same heights (lengths in the insertion direction of the IC package main body 300a). Note that a cutout surface 370 for positioning is formed at the corner between the walls 302b and 302c, by cutting out the corner. Protrusions 308a and 308b, for preventing erroneous insertion of the IC package main body 300a, are formed toward the left sides of the walls 302a and 302c, respectively. The protrusion 308b protrudes further toward the interior than the protrusion 308a. The protrusions 308a and 308b extend in the insertion direction of the IC package main body 300a, and have arcuate outer surfaces. Locking recesses 311, for engaging the aforementioned locking protrusions 263 when the IC package 300 is mounted in the socket housing 206, are formed in the interior sides of the central portions of the walls 302a and 302c.

The wall thicknesses are formed to be thick at the corners of the walls 302. Receiving portions 310 are formed at positions displaced toward the interior of the frame member 300b from the corners, and upwardly facing receiving bases 310a are formed there (refer to FIG. 15A). That is, the receiving bases 310 face the IC package main body 300a. Tapers 310b, for guiding the IC package main body 300b, are formed on the receiving portions 310, in the vicinity of the upper edges 314a of the walls 302. The receiving bases 310a are formed in the vicinity of the lower edges 314 of the walls 302, continuous with the tapers 310 via guide surfaces 310e. The receiving portions 310 have high strength, because they are formed in the corners of the walls 302, and therefore are not likely to deform even when they receive the load of the IC package main body 300a. The guide surfaces 310e function to guide the IC package main body 300a, which is to be inserted.

Two extraction preventing protrusions 312 are formed at the central portions on each of the walls 302b and 302d, separated from each other. The extraction preventing protrusions 312 extend from the upper edge 314a to the lower edge 314b of the frame member 300b. Tapers 312a are formed on the extraction preventing protrusions 312 at the side of the upper edge 314a, to facilitate insertion of the IC package main body 300a. Stop surfaces 312b are formed on the extracting preventing protrusions 312 at the side of the lower edge 314b. The frame member 300b is configured to hold the inserted IC package main body 300a between the receiving bases 310a and the stop surfaces 312b. As illustrated in FIGS. 16A and 16C, L-shaped grooves 310c that open toward the lower edge 314b of the walls 302 and a groove 310d that corresponds to the shape of the cutout surface 370 are formed at the thick portions of the receiving portions 310.

Next, the IC package main body 300a will be described with reference to FIGS. 13A through 14C. The IC package main body 300a comprises a substantially square planar base plate 322, a chip section 320 formed at the center of the base plate 322 and conductive pads 324 which are formed on the bottom surface 322a of the base plate 322. The conductive pads 324 are the electrodes of the IC package 300 and are arranged in a matrix corresponding to the contacts 230. Recesses 328a and 328b, which are complementary with the arcuate shapes of the protrusions 308a and 308b of the frame member 300b, are formed in the base plate 322 at positions corresponding to those of the protrusions 308a and 308b.

In order to mount the IC package main body 300a into the frame member 300b, the protrusions 308a and 308b of the frame member 300b are aligned with the recesses 328a and 328b of the IC package main body 300a, then the IC package main body 300a is pressed into the frame member 300b in the direction indicated by arrow 326 of FIG. 13C. The IC package main body 300a flexes the walls 302b and 302d of the frame member 300b outward via the extraction preventing protrusions 312, and moves toward the interior of the frame member 300b. When the IC package main body 300a passes the stop surfaces 312b, the walls 302b and 302d return elastically, to hold the IC package main body 300a between the receiving bases 310a of the receiving protrusions 310 and the stop surfaces 312b of the extraction preventing protrusions 312. The IC package 300, constituted by the frame member 300b mounted about the periphery of the IC package main body 300a, is easy to hold and handle.

Figure 18:
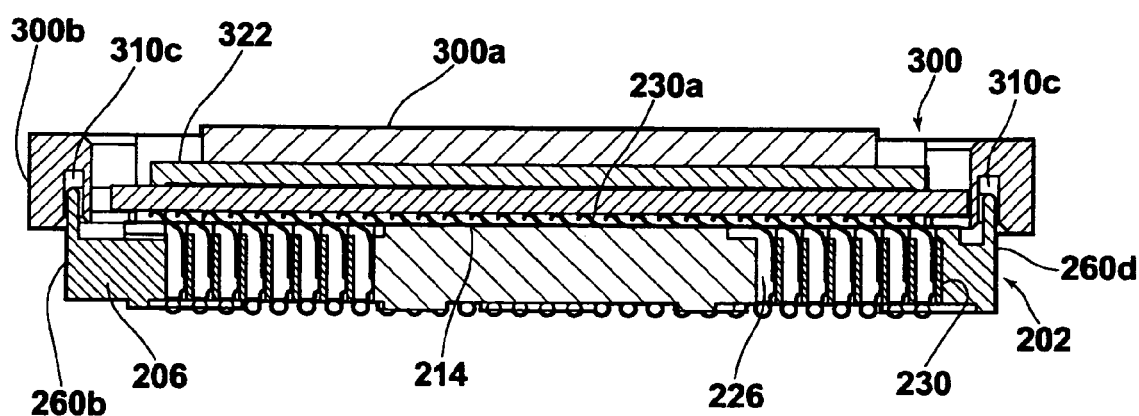
FIG. 18 is a sectional view taken along line 18-18 of FIG. 17A.

Next, a state in which the IC package 300 is mounted in the socket housing 206 will be described with reference to FIGS. 17A through FIG. 18. FIGS. 17A and 17B illustrate a state in which the IC package 300 is mounted in the socket housing 206. FIG. 17A shows that the locking recesses 311 of the frame member 300b are engaged with the locking protrusions 263 of the socket housing 206. The locking recesses 311 and the locking protrusions 263 constitute a simple locking means. As clearly illustrated in FIG. 18, the contacts 230 are provided in the contact housing apertures 226 formed through the socket housing 206, and the contact portions 230a protrude through the IC package mounting surface 214. The IC package 300 is mounted on the IC package mounting surface 214, by aligning the cutout surface 370 of the IC package 300 with the cutout surface 266 of the socket housing 6. The walls 260a, 260b, 260c, and 260d of the socket housing 206 enter and are engaged with the grooves 310c and 310d of the IC package 300. The pads 324 of the IC package 300 contact the contact portions 230a of the contacts 230.

Note that the description above illustrates the mounting relationship between the IC package 300 and the socket housing 206. However, in actual use, the socket housing 206 is built in to the IC socket 202, and the IC package 300 is mounted into the socket housing 206, which is built in to the IC socket 202.

Embodiments of the present invention have been described above. However, the present invention is not limited to the above embodiments, and various changes and modifications are possible as long as they do not depart from the spirit of the invention. For example, the IC socket assembly may be of the type as disclosed in Japanese Unexamined Patent Publication No. 2004-335534, which comprises a heat sink mounted on the IC package. In this case, the heat sink is urged by a lever to mount the IC package in the IC socket. As described previously, in the case that the simple locking means constituted by the locking recesses 311 of the IC package 300 and the locking protrusions 263 of the socket housing 206 are in engagement, a pressing mechanism for pressing the IC package 300 onto the socket housing 206 may be integrated with the urging mechanism. That is, the IC package 300 and the socket housing 206 are engaged to each other and do not move relative to each other, and therefore, the mechanism in which the lever presses the IC package 300 via the heat sink may serve both to mount (urge into close contact) the heat sink onto the IC package, and to press the IC package 300 onto the socket housing 206.

Various types of IC packages such as the PGA type and the LGA type have been described. However, the IC package is not limited to these types, and may be of any type, as long as the concept of the present invention can be applied thereto. In addition, the IC socket and the IC socket assembly are not limited to those compatible with the PGA type and the LGA type.

In the embodiments described above, the frame members 100b and 300b were separate structures from the IC package main bodies 100a and 300a. However, the frame member and the IC package main body may be of an integrated construction.

Advantageously, the IC package 100 of the present invention is provided with the frame member 100b at its peripheral portion. Therefore, the size of the IC package 100 becomes greater than the IC package mounting surface 14 of the IC socket 2, facilitating handling thereof. Further, even if the IC package 100 is dropped on the IC socket 2, if the IC socket 2 is a PGA IC package, the frame member 100b strikes the socket housing 6, and protects the lead contacts 30 of the IC package, thereby preventing deformation thereof. If the IC socket 100 is an LGA IC package, the distance between fingers that hold the frame member 100b and the contacts 30 of the IC socket increases, thereby decreasing the possibility that the fingers will contact and deform the contacts at the IC package mounting surface 14.

What is claimed is:

1. An IC socket, comprising:
   a plurality of electrical contacts;
   an IC package mounting surface;
   an insulative socket housing for holding the plurality of electrical contacts at the IC package mounting surface; and
   an urging member for urging an IC package, which is mounted on the IC package mounting surface, toward the plurality of electrical contacts so as to establish electrical connections therewith;
   the IC package having a frame member with peripheral walls provided about the periphery of the main body thereof and receiving protrusions formed on inner sides thereof for holding the IC package mounted in the frame member.

2. The IC socket of claim 1 wherein the peripheral walls cover the periphery of the IC package main body, two opposing ones of the peripheral walls are formed as relatively short height walls and the other two peripheral walls are formed as relatively tall height walls having greater heights that the relatively short height walls.

3. The IC socket of claim 2 further comprising protrusions on the peripheral walls for preventing erroneous insertion of the IC package.

4. The IC socket of claim 2 wherein each receiving protrusion comprises a receiving base for receiving the IC package.

5. The IC socket of claim 4 wherein each receiving protrusion comprises a taper for facilitating insertion of the IC package.

6. The IC socket of claim 5 further comprising an extraction preventing protrusion formed between two of the receiving protrusions on the peripheral walls.

7. The IC socket of claim 6 wherein the extraction preventing protrusion extends from an upper edge of the frame member to a lower edge thereof.

8. The IC socket of claim 7 further comprising a taper formed on the extraction preventing protrusion near the upper edge to facilitate insertion of the IC package main body.

9. The IC socket of claim 8 further comprising a stop surface formed on the extracting preventing protrusion near the lower edge.

10. The IC socket of claim 9 wherein the frame member is configured to hold the inserted IC package main body between the receiving bases and the stop surface.

11. The IC socket of claim 10 wherein the receiving protrusions are formed in the vicinities of corners of the frame member.

12. An IC socket assembly, comprising:
an IC socket, comprising:
a plurality of electrical contacts;
an IC package mounting surface;
an insulative socket housing for holding the plurality of electrical contacts at the IC package mounting surface; and
an urging member for urging an IC package, which is mounted on the IC package mounting surface, toward the plurality of electrical contacts so as to establish electrical connections therewith; and
an IC package having a frame member with peripheral walls provided about the periphery of the main body thereof and receiving protrusions formed on inner sides thereof for holding the IC package mounted in the frame member.

13. The IC socket assembly of claim 12 wherein the peripheral walls cover the periphery of the IC package main body, two opposing ones of the peripheral walls are formed as relatively short height walls and the other two peripheral walls are formed as relatively tall height walls having greater heights than the relatively short height walls.

14. The IC socket assembly of claim 13 further comprising protrusions on the peripheral walls for preventing erroneous insertion of the IC package.

15. The IC socket assembly of claim 13 wherein each receiving protrusion comprises a receiving base for receiving the IC package.

16. The IC socket assembly of claim 15 wherein each receiving protrusion comprises a taper for facilitating insertion of the IC package.

17. The IC socket assembly of claim 16 further comprising an extraction preventing protrusion formed between two of the receiving protrusions on the peripheral walls.

18. The IC socket assembly of claim 17 wherein the extraction preventing protrusion extends from an upper edge of the frame member to a lower edge thereof.

19. The IC socket assembly of claim 18 further comprising a taper formed on the extraction preventing protrusion near the upper edge to facilitate insertion of the IC package main body.

20. The IC socket assembly of claim 19 further comprising a stop surface formed on the extracting preventing protrusion near the lower edge.

21. The IC socket assembly of claim 20 wherein the frame member is configured to hold the inserted IC package main body between the receiving bases and the stop surface.

22. The IC socket assembly of claim 21 wherein the receiving protrusions are formed in the vicinities of corners of the frame member.

23. An IC socket, comprising:
a socket housing having an IC package mounting surface positioned opposite a lower surface;
a plurality of electrical contacts disposed in the socket housing, the electrical contacts extending through the lower surface for connection to a printed circuit board and oppositely extending to a location within the socket housing for electrical connection to contacts of an inserted IC package;
an urging member for urging an IC package, which is mounted on the IC package mounting surface, toward the plurality of electrical contacts; and,
a frame member having peripheral walls which receive a main body of the IC package.

24. The IC socket of claim 23 wherein two opposing ones of the peripheral walls are formed as relatively short height walls and the other two peripheral walls are formed as relatively tall height walls having greater heights than the relatively short height walls.

25. The IC socket of claim 23 further comprising protrusions on the peripheral walls for preventing erroneous insertion of the IC package.

26. The IC socket of claim 23 further comprising receiving protrusions formed on inner sides of the peripheral walls for holding the IC package mounted in the frame member.

27. The IC socket of claim 26 wherein each receiving protrusion comprises a receiving base for receiving the IC package.

28. The IC socket of claim 26 wherein each receiving protrusion comprises a taper for facilitating insertion of the IC package.

29. The IC socket of claim 26 further comprising an extraction preventing protrusion formed between two of the receiving protrusions on the peripheral walls.

30. The IC socket of claim 29 further comprising a stop surface formed on the extracting preventing protrusion near the lower edge.

31. The IC socket of claim 30 wherein the frame member is configured to hold the inserted IC package main body between the receiving protrusions and the stop surface.

* * * * *

UNITED STATES PATENT AND TRADEMARK OFFICE
CERTIFICATE OF CORRECTION

PATENT NO. : 7,361,029 B2
APPLICATION NO. : 11/372572
DATED : April 22, 2008
INVENTOR(S) : Shinichi Hashimoto Page 1 of 1

It is certified that error appears in the above-identified patent and that said Letters Patent is hereby corrected as shown below:

In column 10, line 45 claim 2, "heights that the relatively short" should read --heights than the relatively short--.

Signed and Sealed this

Twenty-ninth Day of July, 2008

JON W. DUDAS
*Director of the United States Patent and Trademark Office*